(12) United States Patent
Pages et al.

(10) Patent No.: US 6,373,100 B1
(45) Date of Patent: Apr. 16, 2002

(54) SEMICONDUCTOR DEVICE AND METHOD FOR FABRICATING THE SAME

(75) Inventors: Irenee M. Pages, Villeneuve Tolosane; Quang X. Nguyen, Castanet-Tolosan, both of (FR); Cynthia Trigas, Munich (DE); Edouard de Frésart, Tempe, AZ (US); Hak-Yam Tsoi, Scottsdale, AZ (US); Rainer Thoma, Gilbert, AZ (US); Jeffrey Pearse, Chandler, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/033,628

(22) Filed: Mar. 4, 1998

(51) Int. Cl.⁷ .............................................. H01L 29/76
(52) U.S. Cl. ........................ 257/343; 257/329; 257/341
(58) Field of Search ................................ 438/269, 268, 438/270, 273, 271, 272, 274, 666, 667; 257/328, 327, 329, 335, 341, 343; 7/11

(56) References Cited

U.S. PATENT DOCUMENTS

| | | | |
|---|---|---|---|
| 3,600,651 A | 8/1971 | Duncan | 317/235 |
| 3,617,826 A | 11/1971 | Kobayashi | 317/235 |
| 4,377,031 A | 3/1983 | Goto et al. | 29/576 |
| 4,636,653 A | 1/1987 | Hsu | 307/253 |
| 4,853,342 A | 8/1989 | Taka et al. | 438/283 |
| 5,155,562 A | * 10/1992 | Tsuchiya | 257/343 |
| 5,342,797 A | * 8/1994 | Sapp et al. | 438/268 |
| 5,374,846 A | 12/1994 | Takemura | 257/592 |
| 5,439,833 A | 8/1995 | Hebert et al. | 438/203 |
| 5,455,190 A | * 10/1995 | Hsu | 438/270 |
| 5,455,448 A | 10/1995 | Benjamin | 257/565 |
| 5,463,241 A | * 10/1995 | Kubo | 257/376 |
| 5,475,243 A | 12/1995 | Saito | 257/171 |
| 5,489,799 A | 2/1996 | Zambrano et al. | 257/587 |
| 5,807,783 A | * 9/1998 | Gaul et al. | 438/406 |

FOREIGN PATENT DOCUMENTS

| | | |
|---|---|---|
| GB | 2243717 | 6/1991 |
| JP | 5561063 | 5/1980 |
| JP | 6092662 | 5/1985 |

* cited by examiner

*Primary Examiner*—Michael Trinh

(57) ABSTRACT

A vertically diffused FET (10) is fabricated on a semiconductor die (11) that includes an N⁺ substrate (12) and an N⁻ epitaxial layer (14). The FET (10) has a source region (36) and a channel region (38) near a front surface (15) of the epitaxial layer (14), and a drain region in the substrate (12). A trench (22) extends through the epitaxial layer (14) to the substrate (12). A conductive layer (24) fills the trench (22), thereby forming a conductive plug (25) electrically coupled to the substrate (12). The conductive plug (25) forms a top side drain electrode of the FET (10).

6 Claims, 1 Drawing Sheet

SEMICONDUCTOR DEVICE AND METHOD FOR FABRICATING THE SAME

BACKGROUND OF THE INVENTION

The present invention relates, in general, to semiconductor devices and, more particularly, to vertical semiconductor devices.

Vertical semiconductor devices such as, for example, vertically diffused field effect transistors are commonly used as high power devices in electronic circuits. A conventional vertically diffused field effect transistor usually has its gate electrode and source electrode on the front side of a semiconductor die on which the transistor is fabricated. The drain electrode of the transistor is typically on the back side of the die. Inter-chip or inter-die wiring is conventionally used for coupling the drain electrode of the transistor to other elements in the circuit. The inter-chip wiring requires back side metal plating and wire bonding, which are complicated and expensive. As the complexity of the circuit increases, the number and complexity of the interconnections between different dies in the circuit also increase. Consequently, the inter-chip wiring process becomes increasingly expensive and increasingly difficult to perform.

Accordingly, it would be advantageous to have a vertical semiconductor device on a chip and a method for fabricating the device, so that the device can be coupled to an off-chip circuit element without wire-bonding to the back side of the chip. It is desirable for the device to be compatible with a simple and cost efficient packaging process. It is also desirable for the device and the interconnection between the device and other circuit elements in a circuit to be simple, reliable, and cost efficient. It would be of further advantage for the method for fabricating the device to be simple and compatible with existing semiconductor device fabricating processes.

Figure 1:
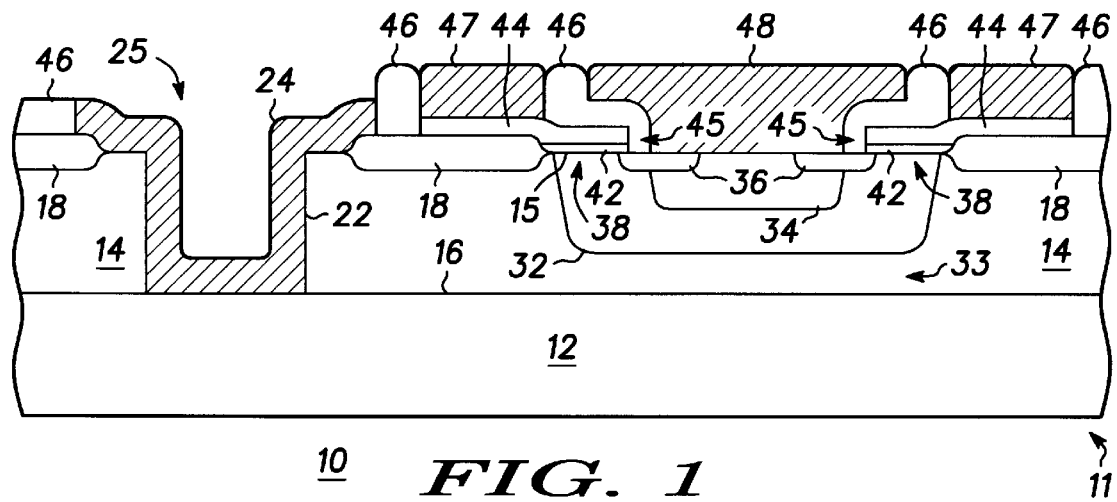
FIG. 1 is a schematic diagram of a semiconductor device in accordance with the present invention.

It should be understood that for simplicity and clarity of illustration, the figures are not necessarily drawn to scale. It should also be understood that, where considered appropriate, reference numerals have been repeated among the figures to indicate corresponding or analogous elements.

DETAILED DESCRIPTION OF THE DRAWINGS

Generally, the present invention provides a semiconductor device and a method for fabricating the semiconductor device on a semiconductor die. More particularly, the device is a vertical semiconductor device that includes a conductive plug in the die. The conductive plug is electrically coupled to a region of the die near its back side. Therefore, an electrode of the vertical semiconductor device that would have been conventionally formed on the back side of the die is brought to the front side of the semiconductor die via the conductive plug. With all of its electrodes on the front side of the die, the vertical semiconductor device can be coupled to other elements of a circuit without wire bonding to the back side of the die.

A semiconductor device 10 in accordance with the present invention is schematically shown in FIG. 1. By way of example, semiconductor device 10 is a vertical field effect transistor (FET) and FIG. 1 shows a cross-sectional view of a portion of FET 10. Vertical FETs is often used in high power applications such as, for example, motor control, power supply switching, etc. For example, vertical FETs can be used as dual high side switches, H-Bridge switches, etc.

FET 10 is fabricated on a semiconductor die 11 that includes a body of a semiconductor material, i.e., a semiconductor substrate 12, and a semiconductor layer 14 over substrate 12. By way of example, semiconductor substrate 12 is a silicon substrate and semiconductor layer 14 is an epitaxially grown silicon layer. An active region of FET 10 is to be formed in epitaxial layer 14.

Substrate 12 is doped with ions of N conductivity type such as, for example, phosphorus ions or arsenic ions. Preferably, substrate 12 has a high dopant concentration, e.g., a dopant concentration between approximately $1 \times 10^{19}$ atoms per cubic centimeter (atoms/cm$^3$) and approximately $1 \times 10^{21}$ atoms/cm$^3$, in order to achieve a high conductivity, i.e., a low resistivity. For example, the resistivity of substrate 12 is preferably lower than approximately 6 milliohm·centimeters (mΩ·cm). Silicon doped with phosphorus ions at a very high dopant concentration, e.g., a dopant concentration greater than or equal to approximately $5 \times 10^{20}$ atoms/cm$^3$, is sometimes referred to as red phosphorus silicon. Red phosphorus silicon has a very low resistivity, e.g., as low as approximately 1 mΩ·cm. Typically, red phosphorus silicon has a resistivity that is approximately 25% lower than that of a conventional N$^+$ doped silicon. Therefore, red phosphorus silicon is a preferred material for substrate 12 in order to achieve a small series resistance of FET 10. The series resistance of FET 10 also depends on the thickness of substrate 12. By way of example, the thickness of substrate 12 is in a range between approximately 200 micrometers (μm) and approximately 800 μm.

Epitaxial layer 14 is also doped with ions of N conductivity type such as, for example, phosphorus ions or arsenic ions. The dopant concentration of epitaxial layer 14 is lower than that of substrate 12. That is, epitaxial layer 14 is lightly doped with N conductivity type ions. For example, the dopant concentration of epitaxial layer 14 is in a range between approximately $1 \times 10^{16}$ atoms/cm$^3$ and approximately $1 \times 10^{18}$ atoms/cm$^3$, and epitaxial layer 14 has a thickness between approximately 1 μm and approximately 5 μm. The breakdown voltage of FET 10 depends on the dopant concentration and thickness of epitaxial layer 14. For example, the thickness of epitaxial layer 14 is preferably in a range between approximately 3 μm and approximately 4 μm if FET 10 is designed to have a breakdown voltage of approximately 30 volts (V). Epitaxial layer 14 has a major surface 15 opposite to an interface 16 between substrate 12 and epitaxial layer 14. Major surface 15 is also referred as a front surface of epitaxial layer 14.

Field oxide regions 18 are disposed over portions of major surface 15 in a local oxidation of silicon (LOCOS) process. Field oxide regions 18 serve as isolation structures that provide isolation between different electrodes of FET 10. An ion implantation is optionally performed before forming field oxide regions 18 to form heavily doped regions (not shown) under field oxide regions 18. The heavily doped regions (not shown) prevent inadvertent turning on of parasitic field effect transistors formed under field oxide regions 18. It should be understood that the isolation structures on epitaxial layer 14 can be formed using other processes such as, for example, poly-buffered LOCOS, poly-encapsulated LOCOS, etc.

Epitaxial layer 14 has a trench 22 formed therein. Trench 22 extends from major surface 15 through epitaxial layer 14 to interface 16. Alternatively, trench 22 extends partially into substrate 12. In other words, the bottom of trench 22 is either on interface 16 or inside substrate 12. By way of example, trench 22 is formed via an anisotropic etching process. A conductive layer 24 fills trench 22. Suitable materials for conductive layer 24 include aluminum and its alloys, such as, for example, aluminum-silicon alloy, aluminum-silicon-copper alloy, aluminum-copper alloy, aluminum-tungsten alloy, and the likes. So, conductive layer 24 is sometimes also referred to as a metal layer. Techniques for forming conductive layer 24 in trench 22 include chemical vapor deposition, sputtering, etc. FIG. 1 shows that conductive layer 24 is formed on the bottom and the sidewall of trench 22. It should be noted that this is not intended as a limitation of the present invention. In an alternative embodiment, the conductive material completely fills trench 22. Conductive layer 24 and trench 22 form a conductive plug 25 extending from major surface 15 through epitaxial layer 14 and in contact with substrate 12.

Ions of P conductivity type such as, for example, boron ions are doped into a portion of epitaxial layer 14 to form a P conductivity type well 32 that extends from major surface 15 into epitaxial layer 14. Well 32 serves as an active region of FET 10. In one embodiment, well 32 extends partially into epitaxial layer 14, i.e., well 32 has a depth less than the thickness of epitaxial layer 14. Therefore, there is a region 33 between well 32 and substrate 12 that remains as lightly doped with N conductivity type ions. In an alternative embodiment (not shown), well 32 extends all the way through epitaxial layer 14 to interface 16, i.e., well 32 has a depth substantially equal to the thickness of epitaxial layer 14. Well 32 can be formed in an ion implantation process, a diffusion process, or a combination thereof. In a preferred embodiment, the depth of well 32 is between approximately 0.8 $\mu$m and approximately 1.8 $\mu$m. When FET 10 is designed to have a breakdown voltage of approximately 30 V, the thickness of well 32 is preferably between approximately 1 $\mu$m and approximately 1.5 $\mu$m. The dopant concentration of well 32 is preferably between approximately $1\times10^{16}$ atoms/cm$^3$ and approximately $1\times10^{18}$ atoms/cm$^3$. Because of its relatively low dopant concentration, well 32 is also referred to as a P$^-$ well.

A P$^+$ doped region 34 is formed within well 32 by doping additional P conductivity type ions into a portion of P$^-$ well 32 adjacent major surface 15. The dopant concentration of P$^+$ doped region 34 is preferably between approximately $1\times10^{17}$ atoms/cm$^3$ and approximately $1\times10^{20}$ atoms/cm$^3$. P$^+$ doped region 34 has a depth less than that of well 32. For example, the depth of P$^+$ doped region 34 ranges between approximately 0.25 $\mu$m and approximately 1 $\mu$m. A more preferred range for the depth of P$^+$ doped region 34 is between approximately 0.4 $\mu$m and approximately 0.6 $\mu$m. Like well 32, P$^+$ doped region 34 can be formed in an ion implantation process, a diffusion process, or a combination thereof. In operation, P$^+$ doped region 34 functions as a body contact region of FET 10.

Ions of N conductivity type such as, for example, arsenic ions or phosphorus ions are doped into a portion of well 32 to form an N$^+$ doped region 36 adjacent major surface 15. Preferably, N$^+$ doped region 36 is formed as a ring in well 32, and FIG. 1 shows a cross section of the ring structure. The dopant concentration of N$^+$ doped region 36 is preferably between approximately $1\times10^{19}$ atoms/cm$^3$ and approximately $1\times10^{21}$ atoms/cm$^3$. N$^+$ doped region 36 has a depth less than that of well 32. For example, the depth of N$^+$ doped region 36 ranges between approximately 0.25 $\mu$m and approximately 1 $\mu$m. A more preferred range for the depth of N$^+$ doped region 36 is between approximately 0.4 $\mu$m and approximately 0.6 $\mu$m. Like well 32, N$^+$ doped region 36 can be formed in an ion implantation process, a diffusion process, or a combination thereof. In operation, N$^+$ doped region 36 functions as a source region of FET 10.

A dielectric layer 42 is disposed over major surface 15 of epitaxial layer 14. By way of example, dielectric layer 42 is a layer of silicon dioxide and has a thickness between approximately 30 nanometers (nm) and approximately 80 nm. Dielectric layer 42 can be disposed on major surface 15 via an oxidation process, a deposition process, or the like. A conductive layer such as, for example, a polycrystalline silicon layer 44 is disposed over dielectric layer 42. In a preferred embodiment, a portion of polysilicon layer 44 overlying well 32 has a thickness between approximately 400 nm and approximately 700 nm. Polysilicon layer 44 is preferably doped to increase its conductivity. Polysilicon layer 44 and dielectric layer 42 are patterned to overlie a portion of well 32 that is adjacent source region 36. After patterning, portions of polysilicon layer 44 and dielectric layer 42 overlying well 32 function as a gate structure 45 of FET 10. The portion of well 32 underlying gate structure 45 functions as a channel region 38 of FET 10.

A dielectric separation layer 46 is disposed over gate structure 45 and over portions of major surface 15 adjacent gate structure 45. Dielectric separation layer 46 forms spacers around gate structure 45. In a preferred embodiment, dielectric separation layer 46 is made of trimethyl phosphite doped tetraethyl orthosilicate. It should be noted that dielectric separation layer 46 can also be formed from other insulating materials such as silicon nitride, silicon dioxide, or the like.

Conductive structures 47 and 48 are disposed over epitaxial layer 14. Conductive structures 47 and 48 are separated from each other by dielectric separation layer 46. Conductive structure 47 is in contact with polysilicon layer 44 and functions as a gate electrode of FET 10. Preferably, conductive structure 47 is formed as a ring over polysilicon layer 44, and FIG. 1 shows a cross section of the ring structure. Conductive structure 48 overlies and is in contact with source region 36 and body contact region 34. Conductive structure 48 functions as a source electrode of FET 10. Like conductive layer 24 in trench 22, gate electrode 47 and source electrode 48 can be formed from any conductive material such as, for example, aluminum, aluminum-silicon alloy, aluminum-silicon-copper alloy, aluminum-copper alloy, aluminum-tungsten alloy, etc. Techniques for forming gate electrode 47 and source electrode 48 include chemical vapor deposition, sputtering, etc. Further, the formation of gate electrode 47 and source electrode 48 can be performed simultaneously with the process of forming conductive layer 24 in trench 22.

FIG. 1 shows source electrode 48 in contact with both source region 36 and body contact region 34. Therefore, FET 10 is a three-terminal device with its source bias and body bias coupled together. It should be noted that this is not a limitation of the present invention. In an alternative embodiment, source electrode 48 is in contact only with source region 36, and another conductive structure (not shown) is formed over epitaxial layer 14 and is in contact with body contact region 34. In such alternative embodiment, FET 10 is a four-terminal device.

After forming conductive structures 47 and 48, a dielectric layer (not shown in FIG. 1) is formed over epitaxial layer 14 and serving as an interlayer dielectric (ILD). Using techniques well known in the art, metallization regions (not shown in FIG. 1) are formed in the ILD to lead the electrodes of FET 10 to the upper surface of the ILD. It should be understood that the ILD and the metallization regions therein are optional in FET 10.

In FET 10, substrate 12 functions as a drain region. In operation, FET 10 conducts an electric current when charge carriers, i.e., electrons, flow from source region 36, through well 32, and into substrate 12. After reaching substrate 12, charge carriers flow out of die 11 via conductive plug 25. Therefore, conductive plug 25 functions as a drain electrode of FET 10. Because it leads charge carriers away from FET 10 through the top side of die 11, conductive plug 25 is also referred to as a top side drain electrode or an up-drain electrode of FET 10. Trench 22 is also referred to as a top side drain trench or an up-drain trench.

N⁻ doped region 33 in epitaxial layer 14 between P⁻ well 32 and substrate 12 functions as a lightly doped drain extension region (LDD) of FET 10. LDD 33 can effectively increase the break down voltage of FET 10. In accordance with the present invention, P⁻ well 32 can be as deep as the thickness of epitaxial layer 14. In other words, LDD 33 is an optional feature in FET 10.

It should be noted that FIG. 1 is a cross-sectional view of only a portion of FET 10. Like many conventional power devices, FET 10 preferably has a multi-finger structure. In other words, FET 10 preferably includes a plurality of P⁻ wells formed in epitaxial layer 14, each P⁻ well having a structure similar to that of well 32. In each of the P⁻ wells formed in epitaxial layer 14, there is a P⁺ body contact region like P⁺ body contact region 34, a source region like source region 36, and a channel region like channel region 38. FET 10 also preferably includes a plurality of source electrodes formed over epitaxial layer 14, each source electrode, e.g., source electrode 48, overlies a respective P⁻ well, e.g., well 32, and is in contact with a respective source region, e.g., source region 36, and a respective P⁻ body contact region, e.g., body contact region 34. A plurality of gate structures overlie the channel regions in the P⁻ wells. Each gate structure, e.g. gate structure 45, includes a dielectric layer, e.g., dielectric layer 42, and a conductive layer, e.g., polysilicon layer 44, and overlies a respective channel region, e.g., channel region 38, in a respective P⁻ well, e.g., P⁻ well 32. In addition, conductive plug 25 preferably has a multi-finger structure, of which FIG. 1 shows the cross section of only one finger. Each finger of conductive plug 25 is preferably disposed adjacent to a corresponding P⁻ well.

Because FET 10 has all its electrodes at the front side of die 11, the packaging of FET 10 is simple and easy. In addition, FET 10 can be coupled to other circuit elements (not shown) without wire bonding to the back side of semiconductor die 11. Although FET 10 is described hereinbefore as a vertical n-channel insulated gate FET, it should be understood that this is not a limitation of the present invention. The principle of the present invention can be practiced in the fabrication of any kind of vertical semiconductor device such as, for example, a vertically diffused p-channel insulated gate FET, a vertical bipolar transistor, a vertical metal semiconductor field effect transistor (MESFET), a vertical resistor, a capacitor, etc. When forming a resistor, the whole epitaxial layer may serve as an active region of the resistor.

Figure 2:
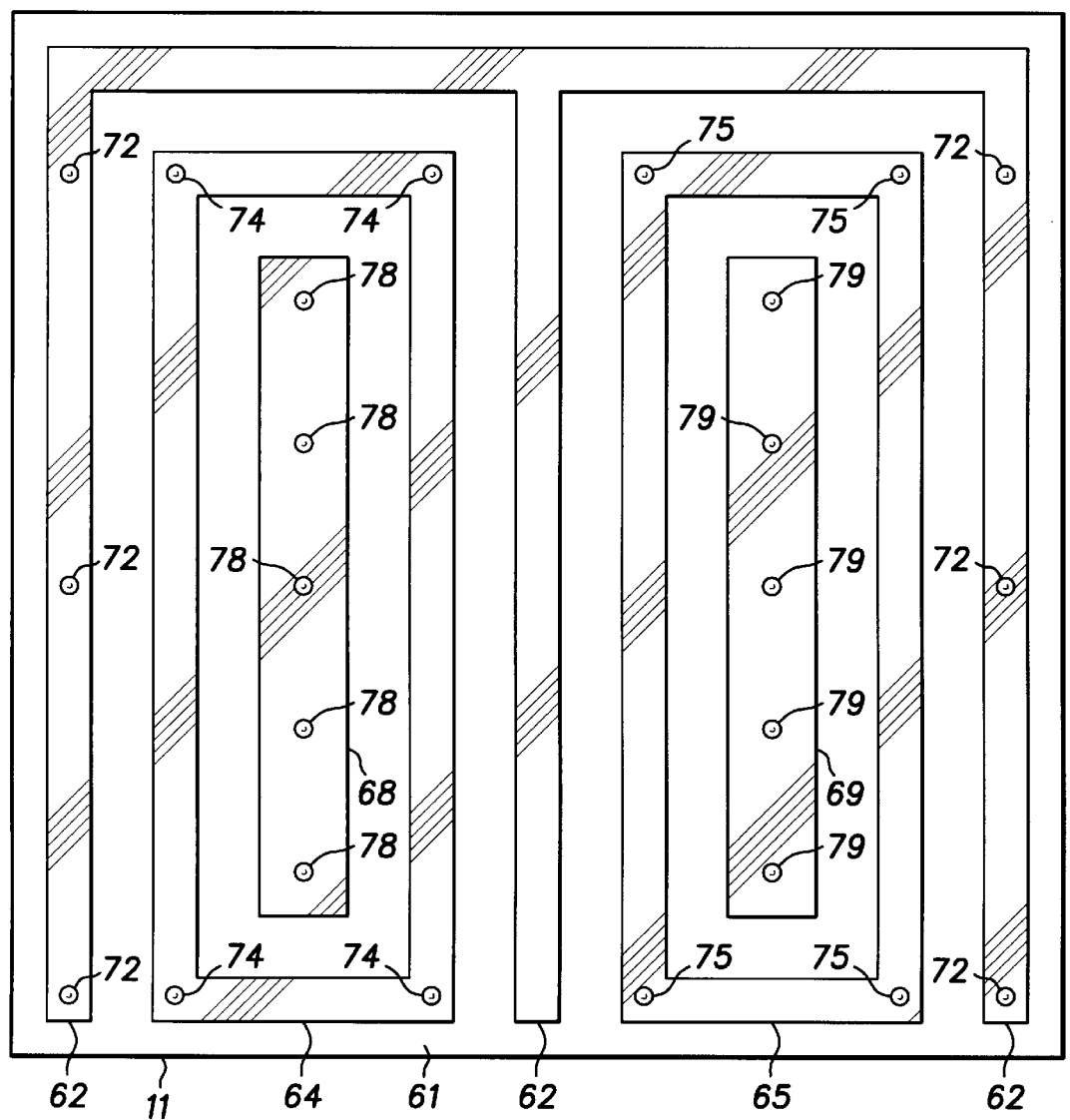
FIG. 2 is a schematic diagram of a flip-chip package that includes the semiconductor device of FIG. 1 in accordance with the present invention.

FIG. 2 is a schematic diagram of a flip-chip package 60 that includes FET 10 formed on semiconductor die 11 as shown in FIG. 1 in accordance with the present invention. More particularly, FIG. 2 illustrates a front view of flip-chip package 60. By way of example, semiconductor die 11 has two P⁻ wells like well 32 shown in FIG. 1, and trench 22 of FIG. 1 has a three-finger structure. A passivation layer (not shown) is usually disposed on the back side of die 11. The passivation layer protects the back side of substrate 12.

In one embodiment (shown in FIG. 2), the front side of die 11 is covered with an ILD 61. Conductive structures, e.g., metallization regions 62, 64, 65, 68, and 69 are formed in ILD 61. Metallization region 62 overlies and is electrically coupled to conductive plug 25 of FIG. 1. Metallization regions 64 and 65 overlie and are electrically coupled to corresponding conductive structures that form the gate electrodes of FET 10, e.g., gate electrode 47 shown in FIG. 1. Metallization regions 68 and 69 overlie and are electrically coupled to corresponding conductive structures that form the source electrodes of FET 10, e.g., source electrode 48 shown in FIG. 1. The front side of die 11 is then planarized. Conductive bumps 72 are formed on metallization region 62 and serve as a drain electrode of FET 10 in flip-chip package 60. Conductive bumps 74 are formed on metallization region 64, and conductive bumps 75 are formed on metallization region 65. Conductive bumps 74 and 75 serve as a gate electrode of FET 10 in flip-chip package 60. Conductive bumps 78 are formed on metallization region 68, and conductive bumps 79 are formed on metallization region 69. Conductive bumps 78 and 79 serve as a source electrode of FET 10 in flip-chip package 60. Conductive bumps 72, 74, 75, 78, and 79 can be formed from any conductive material such as, for example, copper, aluminum, silver, tungsten, gold, etc. via conventional means. It should be noted that the numbers of conductive bumps 72, 74, 75, 78, and 79 are not limited to that shown in FIG. 2. In accordance with the present invention, the number of conductive bumps formed on each of conductive structures 62, 64, 65, 68, and 69 can be any number greater than or equal to one.

In an alternative embodiment (not shown in FIG. 2) of the present invention, dielectric separation layer 46 (shown in FIG. 1), and the conductive structures that form top side drain electrode 25 (shown in FIG. 1), gate electrode 47 (shown in FIG. 1), and source electrode 48 (shown in FIG. 1) are exposed at the front side of semiconductor die 11. Conductive bumps are formed directly on the conductive structures after the front side of die 11 is planarized. The conductive bumps serve as the drain, gate, and source electrodes of FET 10.

It should be understood that the structure of FET 10 is not limited to being that described hereinbefore. For example, FET 10 is not limited to having two P⁻ wells as shown in FIG. 2. FET 10 can have any number of P⁻ wells, e.g., one, three, four, five, six, etc. Further, top side drain electrode 62 is not limited to having a three-finger structure as shown in FIG. 2. FET 10 can also include a plurality of multi-finger elements coupled together. Each multi-finger element has a structure similar to that described hereinbefore and shown in FIG. 2.

Flip-chip package 60 can be mounted on a circuit board (not shown) and coupled to other circuit elements (not shown) using techniques well know in the art. When FET 10 is a power device, a heat sink (not shown) can be attached to the back side of die 11 to alleviate the temperature of FET 10. The connection between FET 10 and other circuit elements is achieved through conductive bumps 72, 74, 75, 78, and 79. There is no wire-bonding to the back side of die 11.

By now it should be appreciated that a vertical semiconductor device and a method for fabricating the device on a semiconductor die have been provided. The vertical semiconductor device of the present invention includes a conductive plug in the semiconductor die. The conductive plug is in contact with a region of the die near its back side. Therefore, an electrode of the device that would have been conventionally formed on the back side of the die is brought to the front side of the die via the conductive plug. With all of its electrodes on the front side of the die, the device can be coupled to other elements of a circuit without wire bonding to the back side of the die. The device fabricated in accordance with the present invention can be packaged in a flip-chip package and mounted on a circuit board. The fabrication of the device in accordance with the present invention is simple and compatible with existing semiconductor device fabricating processes. The process of interconnecting the device to other circuit elements using the flip-chip packaging techniques is simple, reliable, and cost efficient.

What is claimed is:

1. A field effect transistor, comprising:

a body of semiconductor material of a first conductivity type and a first dopant concentration;

a layer of semiconductor material epitaxial grown over said body, said layer having a major surface and a thickness, and being of the first conductivity type and a second dopant concentration that is lower than the first dopant concentration;

a well having a first depth and of a second conductivity type and a third dopant concentration in said layer adjacent the major surface;

a first doped region having a second depth less than the first depth and of the first conductivity type in said well adjacent the major surface of said layer;

a gate structure over the major surface of said layer and patterned to overlie a portion of said well adjacent said first doped region; and a conductive plug extenidng through said layer and electrically coupled to said body, wherein a conductive path is formed through the body of semiconductor material between the conductive plug and a first conductive structure.

2. The field effect transistor of claim 1, wherein the first depth is less than the thickness of said layer.

3. The field effect transistor of claim 1, further comprising a second doped region of the second conductivity type and a fourth dopant concentration in said well adjacent said first doped region, the fourth dopant concentration being higher than the third dopant concentration.

4. The field effect transistor of claim 1, wherein said conductive plug includes:

a trench through said layer; and a metal layer in said trench.

5. The field effect transistor of claim 1, further comprising:

a first conductive structure over the major surface of said layer and electrically coupled to said first doped region;

a second conductive structure over the major surface of said layer and electrically coupled to said gate structure; and a third conductive structure over the major surface of said layer and electrically coupled to said conductive plug.

6. The field effect transistor of claim 5, further comprising:

a first conductive bump electrically coupled to said first conductive structure;

a second conductive bump electrically coupled to said second conductive structure; and a third conductive bump electrically coupled to said third conductive structure.

* * * * *